United States Patent
Vernet

(10) Patent No.: US 7,948,811 B2
(45) Date of Patent: May 24, 2011

(54) MEMORY WITH SHARED READ/WRITE CIRCUIT

(75) Inventor: Marc Vernet, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 91 days.

(21) Appl. No.: 12/540,784

(22) Filed: Aug. 13, 2009

(65) Prior Publication Data

US 2010/0039874 A1 Feb. 18, 2010

(30) Foreign Application Priority Data

Aug. 18, 2008 (FR) ...................... 08 55604

(51) Int. Cl.
*G11C 7/00* (2006.01)

(52) U.S. Cl. .................. 365/189.14; 365/207; 365/205; 365/189.11

(58) Field of Classification Search .................. 365/189.14–189.17, 207, 205, 365/189.11

See application file for complete search history.

(56) References Cited

U.S. PATENT DOCUMENTS

| 6,788,591 | B1 | 9/2004 | Anand et al. | 365/190 |
| 7,684,263 | B2 * | 3/2010 | Adams et al. | 365/189.14 |
| 2002/0163849 | A1 | 11/2002 | Fischer et al. | 365/230.03 |
| 2004/0196692 | A1 | 10/2004 | Haraguchi | 365/155 |

* cited by examiner

*Primary Examiner* — David Lam
(74) *Attorney, Agent, or Firm* — Lisa K. Jorgenson; Allen, Dyer, Doppelt, Milbrath & Gilchrist, P.A.

(57) ABSTRACT

A memory includes memory cells arranged as a matrix of rows and columns between word lines and bit lines, and a set of differential read/write amplifiers for reading and writing of the memory cells and for communicating with local bit lines common to at least some of the memory cells. A read/write circuit is common to the set of differential read/write amplifiers, and a set of selection gateways selectively transfer data between the common read/write circuit and a selected differential read/write amplifier.

28 Claims, 3 Drawing Sheets

MEMORY WITH SHARED READ/WRITE CIRCUIT

FIELD OF THE INVENTION

The invention relates to memory circuits, and in particular, to random access memory (RAM) circuits. More particularly, the invention pertains to a read/write circuit for a RAM memory, and in particular, a dynamic random access memory (DRAM).

BACKGROUND OF THE INVENTION

A DRAM memory conventionally comprises a set of memory points (i.e., memory cells) arranged in a matrix of rows and columns of memory points between word lines and bit lines. Each memory point comprises an access transistor for a DRAM capacitor. The access transistor has a control electrode linked to a word line, a drain linked to a bit liner and a source linked to the DRAM capacitor.

A set of differential read/write amplifiers, generally denoted by the term sense amplifiers, ensures detection of a potential difference between two complementary bit lines BLT and BLC. Selection gateways selectively ensure the transfer of data between each local bit line, and one or more global bit lines or read and write lines.

Various architectures may be used to transfer information between the bit lines and the global bit lines (i.e., read and write lines). A single selection gateway may be used for each differential amplifier. This approach is accompanied by an increased density of components since each selection gateway generally comprises two transistors. Furthermore, the operation of reading such a memory is relatively lengthy. This type of memory does not allow early writing, so that the duration of a write cycle is relatively slow.

To alleviate the problem of slowness of the reading operation, another approach is based on using read/write circuits that are more complete. Each read/write amplifier can be supplemented with a set of transistors for managing the read/write operations on the global bit lines. These additional management transistors are typically eight in number.

Such an architecture enables the read and write operations to be made faster. However, each of the read and write stages must be linked to each read and write line BLT or BLC. Furthermore, the read stage suffers from a major drawback since it comprises MOS transistors placed in series, thereby limiting the current transferred and tending to slow down the memory read operation. Finally, the presence of eight transistors for each differential amplifier increases the overall capacitance of each read/write line of the memory.

SUMMARY OF THE INVENTION

In view of the foregoing background, an object of the present invention is to provide a memory, such as a DRAM memory, having increased speed. In particular, the increased speed is in regards to reading operations.

Another object of the present invention is to reduce the number of components involved in the construction of the read/write circuit of such a memory, and to reduce its capacitance value.

These and other objects, advantages and features in accordance with the present invention are provided by a memory circuit comprising a set of memory points (i.e., memory cells) disposed as a matrix of rows and columns of memory points between word lines and bit lines, and a set of differential read/write amplifiers ensuring the reading and writing of the memory points for communicating with local bit lines common to at least some of the memory points.

The memory circuit may comprise a read/write circuit common to a set of differential amplifiers and linked to read/write lines of the memory, and a set of selection gateways selectively ensuring the transfer of data between the read/write circuit and a selected differential amplifier.

In one embodiment, each gateway may comprise a pair of MOS transistors linked to the differential amplifier and to local bit lines and whose control electrode may receive a selection signal. The read/write circuit may then be linked between local bit lines and read/write lines of the memory.

The read/write circuit may comprise a data read stage linked at an output to data read lines, and linked at an input to two local bit lines, by way of two read control transistors. For example, in one embodiment, the read stage may comprise a switching transistor setting the level of a data read line under the supervision of a corresponding read control transistor. In this case, the read control transistor may be suitable for linking a control electrode of the switching transistor to a local bit line under the supervision of a read control signal.

The read stage may further comprise an information restore circuit for adjusting the level of the voltage delivered by the control transistor to the switching transistor as a function of a restore control signal. Advantageously, the read stage may further comprise circuits for reinitializing the local bit lines.

According to yet another characteristic of the memory circuit, the read/write circuit may also comprise a data write stage for prompting the writing of memory points under the supervision of the selection gateways by way of the differential amplifiers. For example, the write stage may comprise a pair of MOS transistors each linked to a local bit line and whose control electrode is driven by a write line of the memory circuit. For example, the read/write circuit may be common to eight differential amplifiers.

BRIEF DESCRIPTION OF THE DRAWINGS

Other objects, characteristics and advantages of such a memory circuit will become apparent on reading the following description given by way of nonlimiting examples with reference to the appended drawings, in which.

DETAILED DESCRIPTION OF THE PREFERRED EMBODIMENTS

The general architecture of a read/write stage of a DRAM memory will first be described with reference to FIG. 1 according to an exemplary implementation. As known by those skilled in the art, a DRAM memory matrix comprises a set of memory points (i.e., memory cells) arranged as a matrix of rows and columns of memory points between word lines and bit lines.

Figure 1:
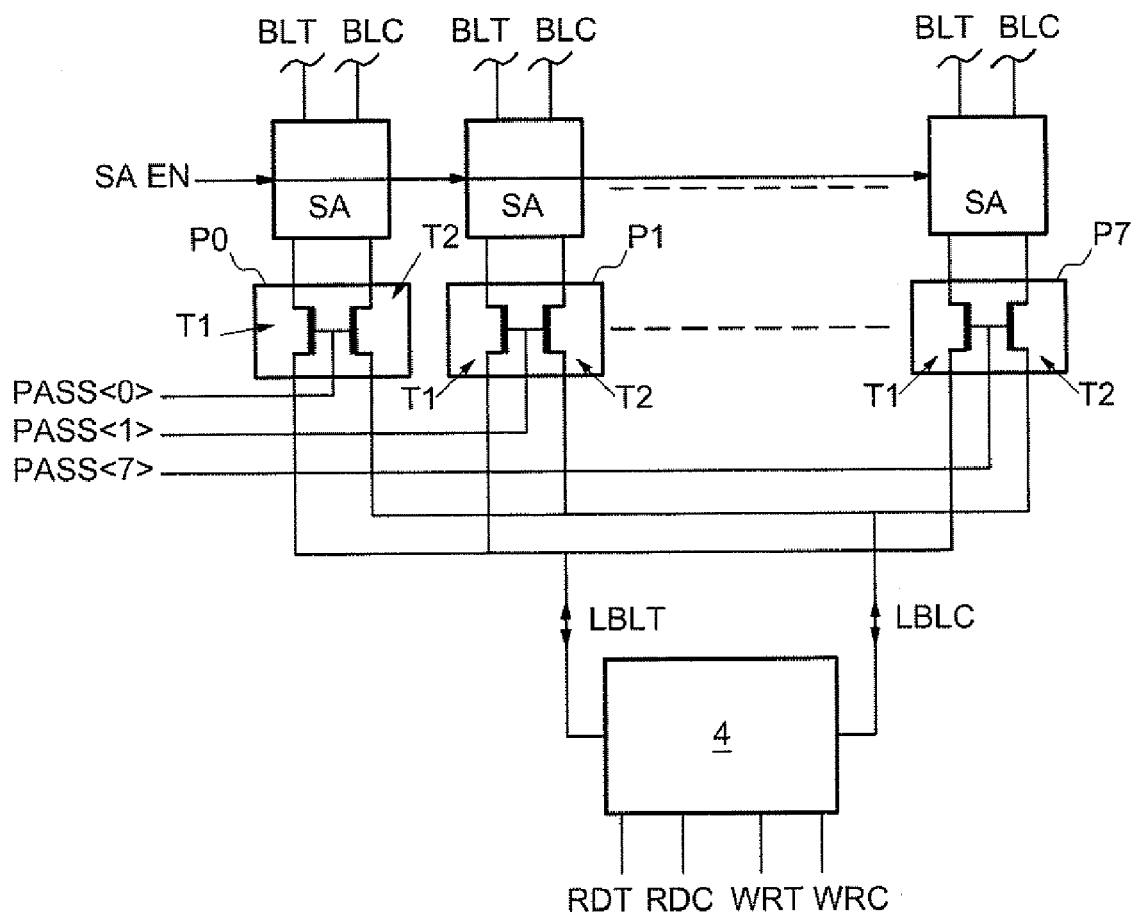
FIG. 1 illustrates the architecture of a read/write stage of a DRAM memory in accordance with the invention.

Since the subject of the present description is essentially the architecture of a read/write stage of such a memory, in FIG. 1 only the part of the memory relating to the transfer of data between read and write lines and bit lines of the matrix has been retained, for the sake of clarity.

FIG. 1 depicts the differential amplifiers SA or sense amplifiers which ensure the detection of information conveyed between complementary bit lines BLT and BLC of the memory matrix. The differential amplifiers are organized into groups of eight amplifiers SA. Depending on the address required for reading or writing, one of the eight amplifiers will be selected for transferring the data item to be read or written.

These differential amplifiers SA are driven by a control signal SA_EN allowing the activation of the amplifiers during memory read and write cycles. The transfer of data between the bit lines BLT and BLC to which the differential amplifiers SA are linked, and read lines RDT and RDC and write lines WRT and WRC is performed with a single read/write circuit 4 common to a differential amplifier set SA of the memory. In particular, the single read/write circuit 4 may be common to the group of eight differential amplifiers SA.

Additionally, the transfer of data between the read/write circuit 4 and each differential amplifier SA is performed by a selection gateway P0, P1, . . . , P7. As will be described in greater detail below, the selection gateways P0, P1, . . . , P7 selectively ensure the transfer of data under the supervision of selection signals PASS<0>, PASS<1> . . . PASS<7>.

As appreciated by those skilled in the art, a distributed architecture is thus obtained, which uses a read/write circuit common to a set of differential amplifiers and selection gateways which permit data transfer between a selected differential amplifier SA and the read/write circuit.

The selection gateways have an identical structure and are formed by associating two N-type MOS transistors T1 and T2 whose gates are linked and receive a corresponding control signal PASS<0>, . . . , PASS<7> and whose drain is linked to a corresponding differential amplifier SA and source is linked to the read/write circuit 4 by way of local bit lines LBLT and LBLC.

Thus, when the selection signal PASS<0>, PASS<7> is set to a high level, the transfer of the data between a differential amplifier and the read/write circuit is permitted. The data present on the other differential amplifiers not forming the subject of a read or write are then refreshed, for example.

Figure 2:
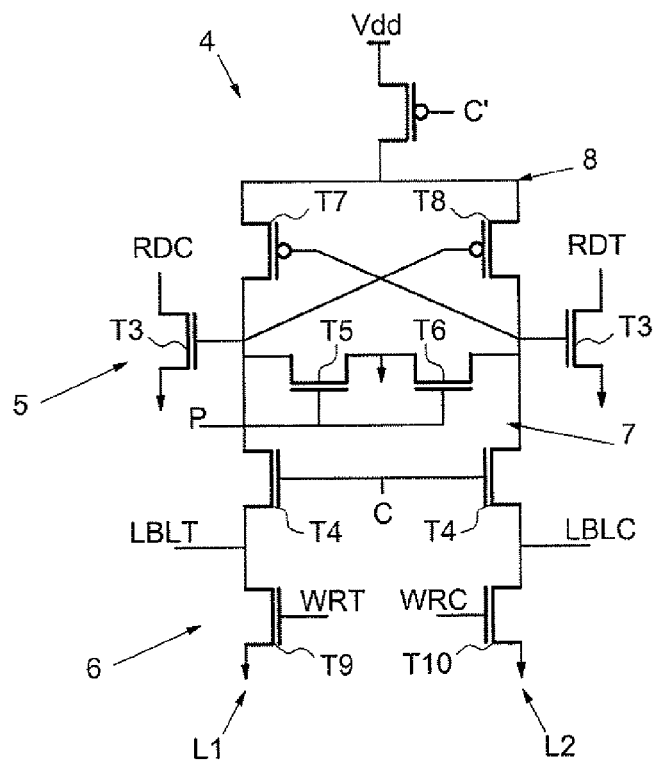
FIG. 2 is a more detailed view of the read/write circuit of FIG. 1.

The general architecture of the read/write circuit 4 will now be described with reference to FIG. 2. This circuit comprises a read stage 5 and a write stage 6, and comprises two data transfer lines L1 and L2 each ensuring the transfer of data between a local bit line LBLT, LBLC and a read line RDC, RDT or a write line WET, WRC, during read and write phases, respectively.

In regards to the write stage 5, the latter comprises in the exemplary embodiment illustrated, for each data transfer line L1 and L2, a first switching transistor T3 whose drain is linked to the read line RDC, RDT and whose source is connected to ground, and a read control transistor T4 whose gate receives a read control signal C, whose source is connected to the gate of the switching transistor T3 and whose drain is connected to the local bit line LBLT, LBLC.

According to this layout, when the read control signal is set, the information conveyed by the local bit line LBLT or LBLC is transferred to the read line RDC or RDT by way of the switching transistor T3. Furthermore, the read circuit 5 comprises a reinitialization circuit 7 serving to refresh the local bit lines LBLT and LBLC by precharging, and an information restore circuit 8.

The reinitialization circuit 7 comprises two N-type MOS transistors T5 and T6 whose gate receives a precharge control signal P, whose drain is connected to a data transfer line L1 or L2 and whose source is connected to ground. According to this layout, when the control signal P is set, the gate of the switching transistors T3 is connected to ground and the levels of the read lines RDC and RDT are then no longer forced. Furthermore, when the control signal C is active, the local bit lines are reset to the precharge state.

The information restore circuit 8 comprises two P-type MOS transistors, denoted by the references T7 and T8. In the exemplary embodiment represented, these transistors are connected as follows. The gate of one of the transistors T7 or T8 is connected to the drain of the other transistor. Furthermore, the gate of one of the transistors and the source of the other transistor are connected to the gate of a switching transistor T3.

Finally, the source of each transistor is connected to the drain of an information restore control transistor T9 whose source is connected to a DC voltage Vdd and whose gate receives a control signal C'. This layout ensures that the voltage present on the gate of each switching transistor T3 is either zero or at the high level, corresponding to the DC supply voltage Vdd.

The write stage 6 comprises, for its part, two N-type MOS transistors T9 and T10 whose drain is connected to ground, whose source is linked to a local bit line LBLT or LBLC, and whose gate is linked to a write line WRT, WRC.

Figure 3:
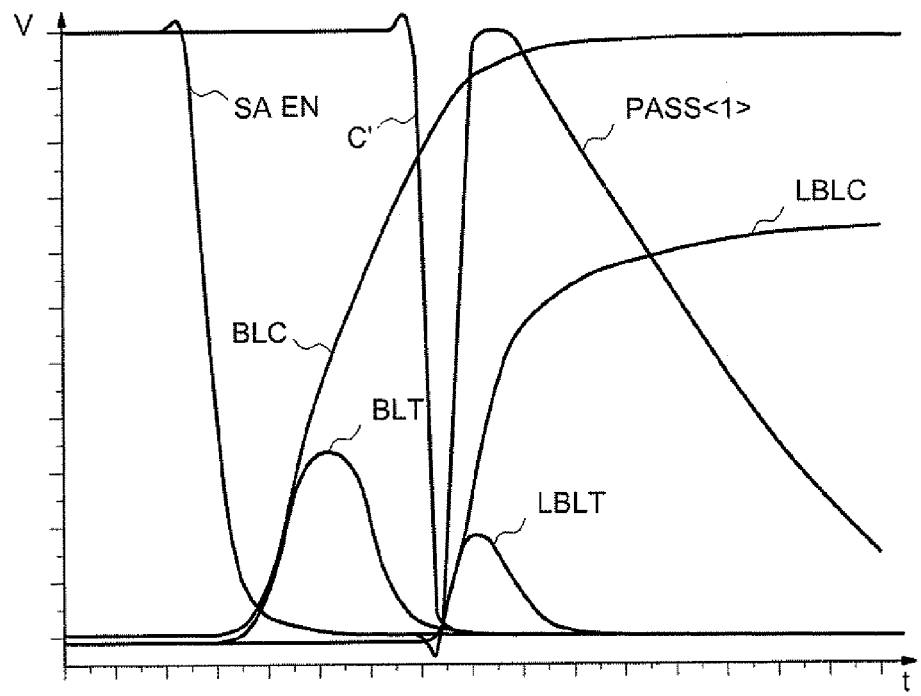
FIG. 3 is a graph illustrating the time dependence of signals in the read/write circuit of FIGS. 1 and 2 during a read operation.

Referring to FIG. 3, during an operation of reading an item of information from the bit lines BLC and BLT of the memory, after the activation of the differential amplifiers SA by a control signal SA_EN applied to the set of amplifiers SA and the selection of a gateway by applying a signal PASS<i>, the signals LBLC and LBLT present on the local bit lines are set as a function of the information from the bit lines BLC and BLT. Likewise, after setting the information restore control signal C', the signals RDC and ROT are set to the high and low levels as a function of the levels present on the local bit lines LBLC and LBLT.

Figure 4:
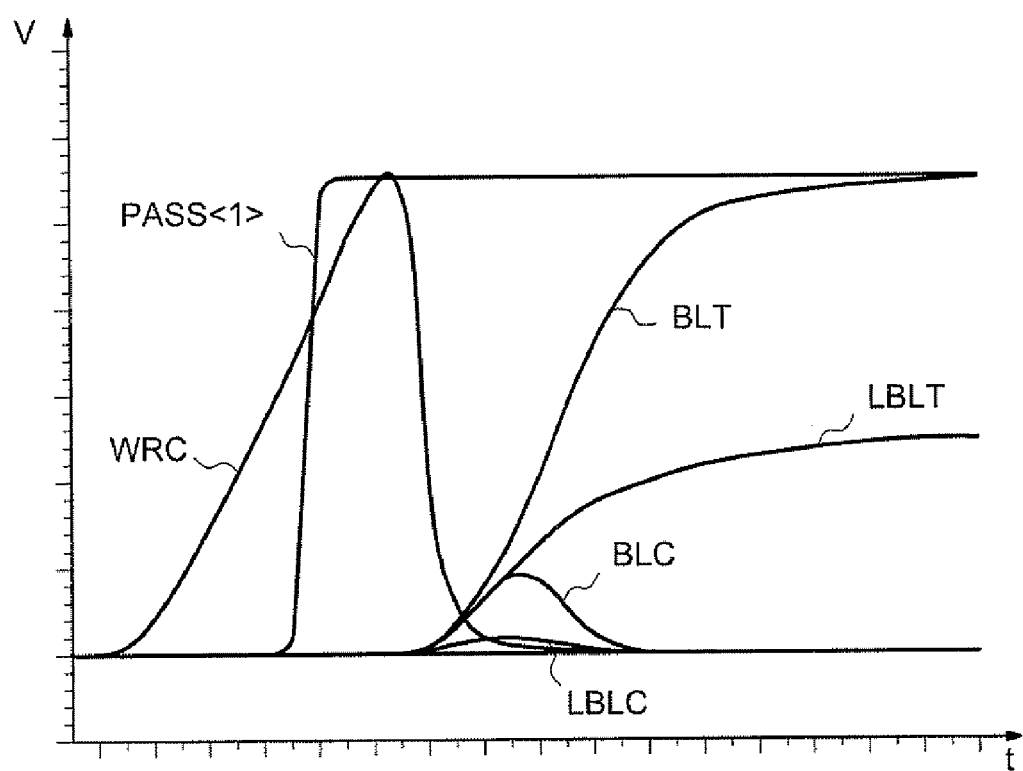
FIG. 4 is a graph illustrating the time dependence of signals of the read/write circuit of FIGS. 1 and 2 during a write operation.

With reference to FIG. 4, during a write operation, the transistors T4 are now off. After selecting a gateway by a signal PASS<i> and activating the differential amplifiers by the signal SA_EN, the information conveyed on the write lines WRT and WRC is transmitted on the local bit lines LBLC and LBLT and then on the bit lines BLT and BLC of the memory. As may be seen, the information on the write lines WRT and WRC can be set before the start of amplification, thus avoiding any constraint on the speed of writing.

As appreciated by those skilled in the art, the invention just described, which uses a common read/write circuit for a set of differential amplifiers, makes it possible to reduce the number of components used to make the read/write circuit in so far as, for a set of eight differential amplifiers, the circuit requires only 27 MOS transistors. It can therefore be installed on a reduced area. Furthermore, it is possible to use transistors of higher capacitance, in particular, to make the switching transistors of the read circuit, thereby making it possible to convey a higher read current which advantageously increases the speed of the reading operation.

That which is claimed:

1. A memory comprising:
   a plurality of memory cells arranged as a matrix of rows and columns;
   at least one differential read/write amplifier set for reading and writing at least a portion of said plurality of memory cells, and comprising a plurality of differential read/write amplifiers;
   a respective read/write circuit coupled to said at least one differential read/write amplifier set, and comprising a data read stage comprising a pair of read control transistors coupled together and forming an output and forming an input; and at least one selection gateway set coupled between said at least one differential read/write amplifier set and said respective read/write circuit, and comprising a plurality of selection gateways for selectively transferring data.

2. The memory according to claim 1, further comprising:
a plurality of local bit lines coupled to the input of said pair of read control transistors of said respective read/write circuit; and
a pair of read lines linked to the output of said pair of read control transistors of said respective read/write circuit.

3. The memory according to claim 2, wherein each selection gateway comprises a pair of gateway transistors coupled together between a respective differential read/write amplifier and said respective read/write circuit, each pair of gateway transistors coupled to said plurality of local bit lines, and each gateway transistor including a control electrode for receiving a selection signal.

4. The memory according to claim 2, wherein said plurality of local bit lines is coupled together to form a pair of local bit lines; and wherein the input of said pair of read control transistors is coupled to said pair of local bit lines.

5. The memory according to claim 4, wherein said data read stage further comprises a pair of switching transistors coupled to said pair of read control transistors, each switching transistor for setting a level of one of said read lines based on said read control transistor associated therewith.

6. The memory according to claim 5, wherein each switching transistor includes a control electrode; and wherein each read control transistor connects the control electrode of said switching transistor associated therewith to one of said local bit lines based on a read control signal.

7. The memory according to claim 6, wherein said data read stage further comprises an information restore circuit for adjusting voltage levels provided by said read control transistors to said switching transistors based on a restore control signal.

8. The memory according to claim 4, wherein said data read stage further comprises a reinitialization circuit coupled to said pair of read control transistors for reinitializing said pair of read lines coupled thereto.

9. The memory according to claim 2, wherein said respective read/write circuit comprises a data write stage for initiating writing of said at least a portion of said plurality of memory cells associated with said at least one selection gateway set via said at least one differential read/write amplifier set.

10. The memory according to claim 9, wherein said data write stage comprises a pair of information restore control transistors, with each information restore control transistor coupled to a local bit line and including a control electrode being driven by a write line.

11. The memory according to claim 1, wherein said respective read/write circuit is common to said at least one differential read/write amplifier set.

12. The memory according to claim 1, wherein said plurality of memory cells is configured so that the memory is a RAM memory.

13. The memory according to claim 12, wherein said RAM memory comprises a DRAM memory.

14. A random access memory (RAM) device comprising:
a plurality of memory cells arranged as a matrix of rows and columns;

at least one differential read/write amplifier set for reading and writing at least a portion of said plurality of memory cells, and comprising a plurality of differential read/write amplifiers;
a plurality of local bit lines coupled to said at least one differential read/write amplifier set, and being coupled together to form a pair of local bit lines; and
a respective read/write circuit coupled to said at least one differential read/write amplifier set via pair of local bit lines;
a pair of read lines and a pair of write lines coupled to said respective read/write circuit;
at least one selection gateway set coupled between said at least one differential read/write amplifier set and said respective read/write circuit, and comprising a plurality of selection gateways for selectively transferring data between said respective read/write circuit and a selected differential read/write amplifier; and
said read/write circuit comprising
a data read stage comprising a pair of read control transistors coupled together and forming an output linked to said pair of read lines and forming an input coupled to said pair of local bit lines, and
a data write stage for initiating writing of said at least a portion of said plurality of memory cells associated with said at least one selection gateway set via said at least one differential read/write amplifier set.

15. The RAM device according to claim 14, wherein each selection gateway comprises a pair of gateway transistors coupled together between a respective differential read/write amplifier and said respective read/write circuit, each pair of gateway transistors coupled to said plurality of local bit lines, and each gateway transistor including a control electrode for receiving a selection signal.

16. The RAM device according to claim 15, wherein said data read stage further comprises a reinitialization circuit coupled to said pair of read control transistors for reinitializing said pair of read lines coupled thereto.

17. The RAM device according to claim 14, wherein said data read stage further comprises a pair of switching transistors coupled to said pair of read control transistors, each switching transistor for setting a level of one of said read lines based on said read control transistor associated therewith.

18. The RAM device according to claim 17, wherein each switching transistor includes a control electrode; and wherein each read control transistor connects the control electrode of said switching transistor associated therewith to one of said local bit lines based on a read control signal.

19. The RAM device according to claim 18, wherein said data read stage further comprises an information restore circuit for adjusting voltage levels provided by said read control transistors to said switching transistors based on a restore control signal.

20. The RAM device according to claim 14, wherein said data write stage comprises a pair of information restore control transistors, each information restore control transistor coupled to a local bit line and including a control electrode being driven by a write line.

21. A method for forming a memory with shared read/write circuits comprising:
forming a plurality of memory cells arranged as a matrix of rows and columns;
forming at least one differential read/write amplifier set for reading and writing at least a portion of the plurality of memory cells, the at least one differential read/write amplifier set comprising a plurality of differential read/write amplifiers;

forming a respective read/write circuit coupled to the at least one differential read/write amplifier set, the respective read/write circuit comprising a data read stage comprising a pair of read control transistors coupled together and forming an output and forming an input; and forming at least one selection gateway set coupled between the at least one differential read/write amplifier set and the respective read/write circuit, the at least one selection gateway set comprising a plurality of selection gateways for selectively transferring data between the respective read/write circuit and a selected differential read/write amplifier.

22. The method according to claim 21, further comprising:
forming a plurality of local bit lines coupled to the input of the pair of read control transistors of the respective read/write circuit; and
forming a pair of read lines linked to the output of the pair of read control transistors of the respective read/write circuit.

23. The method according to claim 22, wherein each selection gateway comprises a pair of gateway transistors coupled together between a respective differential read/write amplifier and the respective read/write circuit, each pair of gateway transistors coupled to the plurality of local bit lines, and each gateway transistor including a control electrode for receiving a selection signal.

24. The method according to claim 22, wherein the plurality of local bit lines is coupled together to form a pair of local bit lines; and wherein the input of the pair of read control transistors is coupled to the pair of local bit lines.

25. The method according to claim 24, wherein the data read stage further comprises a pair of switching transistors coupled to the pair of read control transistors, each switching transistor for setting a level of one of the read lines based on the read control transistor associated therewith.

26. The method according to claim 25, wherein each switching transistor includes a control electrode; and wherein each read control transistor connects the control electrode of the switching transistor associated therewith to one of the local bit lines based on a read control signal; and wherein the data read stage further comprises an information restore circuit for adjusting voltage levels provided by the read control transistors to the switching transistors based on a restore control signal.

27. The method according to claim 24, wherein the data read stage further comprises a reinitialization circuit coupled to the pair of read control transistors for reinitializing the pair of read lines coupled thereto.

28. The method according to claim 22, wherein the respective read/write circuit comprises a data write stage for initiating writing of the at least a portion of the plurality of memory cells associated with the at least one selection gateway set via the at least one differential read/write amplifier set; and wherein the data write stage comprises a pair of information restore control transistors, with each information restore control transistor coupled to a local bit line and including a control electrode being driven by a write line.

* * * * *